United States Patent [19]

Macovski

[11] Patent Number: 4,857,843

[45] Date of Patent: Aug. 15, 1989

[54] SELF-REFERENCING MAGNETIC RESONANCE SPECTROSCOPY SYSTEM

[75] Inventor: Albert Macovski, Menlo Park, Calif.

[73] Assignee: Stanford University, Stanford, Calif.

[21] Appl. No.: 241,785

[22] Filed: Sep. 6, 1988

Related U.S. Application Data

[63] Continuation of Ser. No. 939,053, Dec. 8, 1986, abandoned.

[51] Int. Cl.$^4$ ............................................. G01R 33/20
[52] U.S. Cl. ..................................... 324/307; 324/308
[58] Field of Search ............... 324/307, 308, 309, 310, 324/311, 312

[56] References Cited

U.S. PATENT DOCUMENTS 4,329,646  5/1982  Tsuda ................................. 324/307

FOREIGN PATENT DOCUMENTS 0122593  10/1984  European Pat. Off. ............ 324/307
2126727   3/1984  United Kingdom ................ 324/309

Primary Examiner—Stewart J. Levy
Assistant Examiner—Louis M. Arana
Attorney, Agent, or Firm—Flehr, Hohbach, Test, Albritton & Herbert

[57] ABSTRACT

The amplitude of specific spectroscopic components are measured by first finding their frequency in the presence of inhomogeneity. A large stable component, usually the water line, is used as a frequency standard to determine the amount of frequency shift in each voxel. The frequency standard is used to determine the relative frequencies of each of the desired spectroscopic components. In one approach the entire hydrogen spectrum is envelope detected with the beats between the water line and the spectroscopic components used to provide a stable spectrum, immune to inhomogeneity.

13 Claims, 3 Drawing Sheets

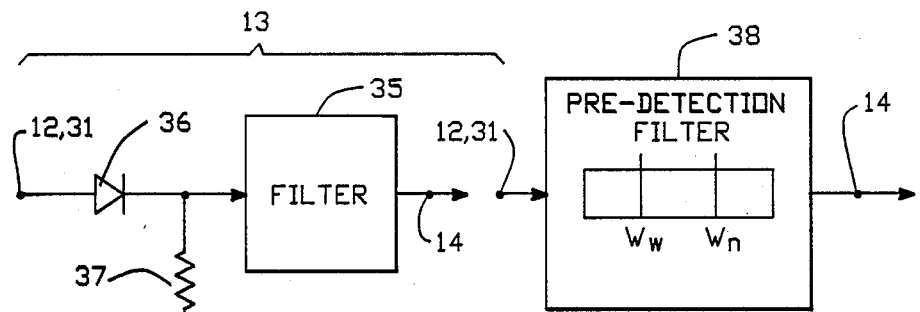
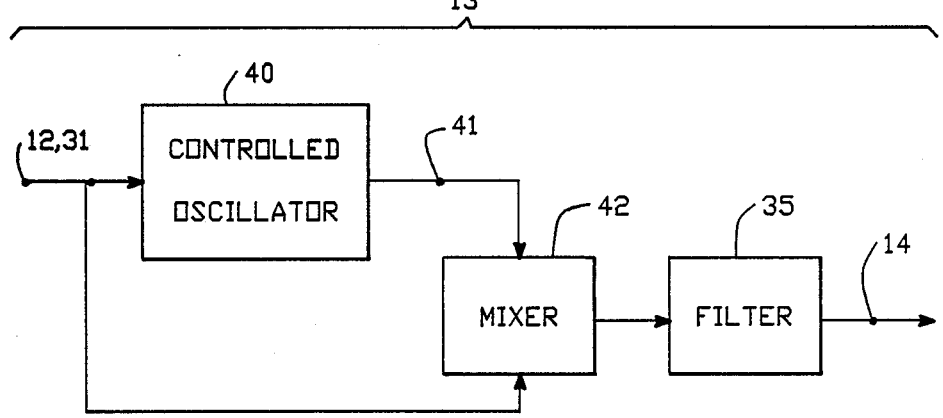
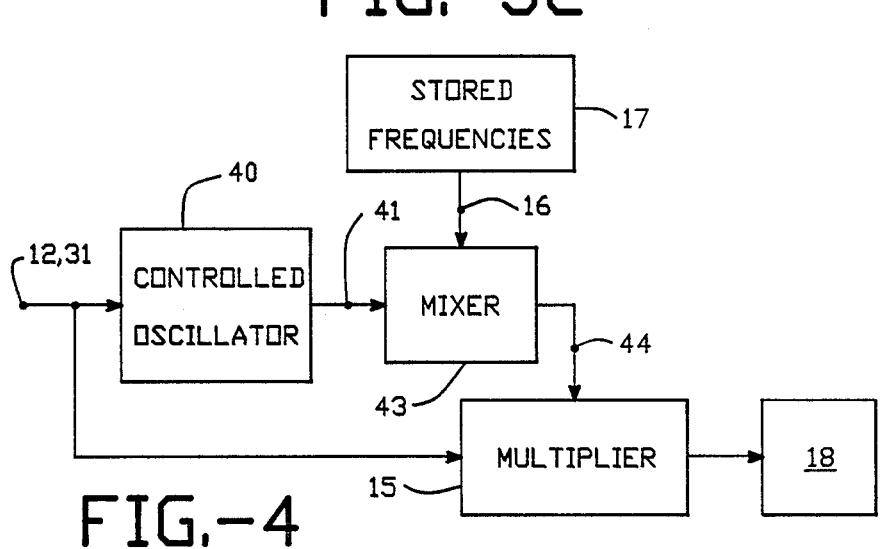

SELF-REFERENCING MAGNETIC RESONANCE SPECTROSCOPY SYSTEM

The U.S. Government has rights in the claimed invention pursuant to NIH Grant No. RO1 HL 34962.

This is a continuation of application Ser. No. 939,053 filed Dec. 8, 1986, now abandoned.

BACKGROUND OF THE INVENTION

1. Field of the Invention

This invention relates to NMR spectroscopy. In a primary application it relates to measuring the amplitude of NMR spectral components with immunity to inhomogeneity.

2. Description of Prior Art·

Magnetic resonance imaging systems currently provide excellent images of the large water line in the hydrogen spectrum. Images are also made of the fat or lipid line in the hydrogen spectrum. A popular method of making images of the lipid line is described in the publication by W. T. Dixon in Radiology, 153:189 (1984). Here data is obtained of both water plus fat and water minus fat, enabling the individual components to be separated.

The thusfar unrealized promise of magnetic resonance, however, is the mapping of the subtle spectroscopic components which can enable the diagnosis of disease through the measurement of important biochemical constituents. Thusfar this is not done on an imaging basis. For the most part, in vivo spectroscopy involves receiving signals representing one region of the anatomy and decomposing that signal, using a Fourier transform, into a frequency spectrum. The spectroscopist observes this spectrum and estimates the relative amplitude of the important components. Methods have recently been devised for moving the volume of observation around. One example is the paper by R. Ordidge in the Book of Abstracts of the 4th Annual Meeting of SMRM, p. 131 (1985).

The first effort at an imaging system which can preserve spectroscopic components is the 3DFT approach described in "In Vivo $^{31}$P NMR Imaging of Phosphor Metabolites," by J. Cuttaselgrove et al., Science 220:1170-1173 (1983). Here a sequence of excitations are used followed by sets of phase encoding pulses which place the resultant signal at a point in the two-dimensional k space. Thus all of k space is covered, given a sufficient number of excitations. Since no readout gradients are used during the time the signals are received, following the phase encoding, the spectroscopic information is preserved, using a 3DFT, with two spatial dimensions and one temporal dimension, the spectrum at each point is found. This approach has two practical problems. Firstly, the acquisition time is relatively long since each excitation represents a single point in k space. Secondly, as a result of inhomogeneity of the magnetic field, the demodulated spectrum at each voxel is shifted an arbitrary amount. This makes it very difficult to create spectroscopic images since the exact frequency reference has been lost.

In an effort to solve the problem of slow acquisition, A. Macovski introduced the use of time-varying gradients. Using periodic gradients, k-space, rather than a point, is covered during each excitation. This is described in the publication "Volumetric NMR Imaging with Time-Varying Gradients," by A. Macovski, J. of Magnetic Resonance in Medicine, 2:29-40, 1985. It is also described in U.S. patent application Ser. No. 603,333, by A. Macovski entitled "Simultaneous NMR Imaging System." This same basic concept of time-varying gradients for spectroscopy is also described in a publication by S. Matsui, K. Sekihara and H. Kohnu, "Spatially Resolved NMR Spectroscopy Using Phase-Modulated Spin-Echo Trains," J. of Magnetic Resonance in Medicine, 67:476-490, 1986.

Over and above the problem of high speed acquisition, is that of sensitivity. Since the metabolites of interest are relatively weak, they can present a significant SNR problem, especially when the acquisition is relatively rapid. The SNR problem can be significantly aided through the use of estimation theory as described in the publication by A. Macovski and D. Spielman, "In Vivo Spectroscopic Magnetic Resonance Imaging Using Estimation Theory," J.·of MR in Medicine, 3:97-104, 1986. Here we make use of the a priori knowledge of the exact frequencies of each signal to estimate the amplitudes in the presence of noise. This provides a dramatic improvement over the prior art. However, inhomogeneity can provide an unknown frequency shift at each voxel.

SUMMARY OF THE INVENTION

An object of this invention is to acquire and process NMR spectroscopic information in the presence of unknown magnetic fields.

A further object of this invention is to map the distribution of specific NMR spectroscopic components in the presence of inhomogeneous magnetic fields.

A further object of this invention is to enable the determination of the amplitude of specific NMR spectroscopic components in the presence of unknown magnetic fields.

A further object of this invention is the acquisition of spectroscopic information which has a large dynamic range.

Briefly, in accordance with the invention, a strong reliable spectroscopic component, such as the water line in the hydrogen spectrum, is used to determine the frequency of other desired spectroscopic components independent of magnetic field. In one embodiment the difference frequency between water and other desired spectroscopic is used to establish a magnetic-field-immune spectroscopic signal which can then be accurately estimated by coherent detection. The difference frequency can be obtained by taking the magnitude or envelope of the signal representing each voxel. The frequency of the water signal at each voxel can also be used to find the desired spectroscopic components of other species such as phosphorous. Here the measured shift in the water time due to inhomogeneity is multiplied by the ratio of the phosphorous gyromagnetic ratio to the water gyromagnetic ratio to obtain the frequency shift at the phosphorous spectrum.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIG. 3c is a schematic representation of an alternate embodiment for obtaining difference frequencies using a controlled oscillator and mixer, FIG. 4 is a schematic representation of an embodiment for correcting the frequency of the refernce signal rather than the received signal.

DESCRIPTION OF THE PREFERRED EMBODIMENT

Figure 1:
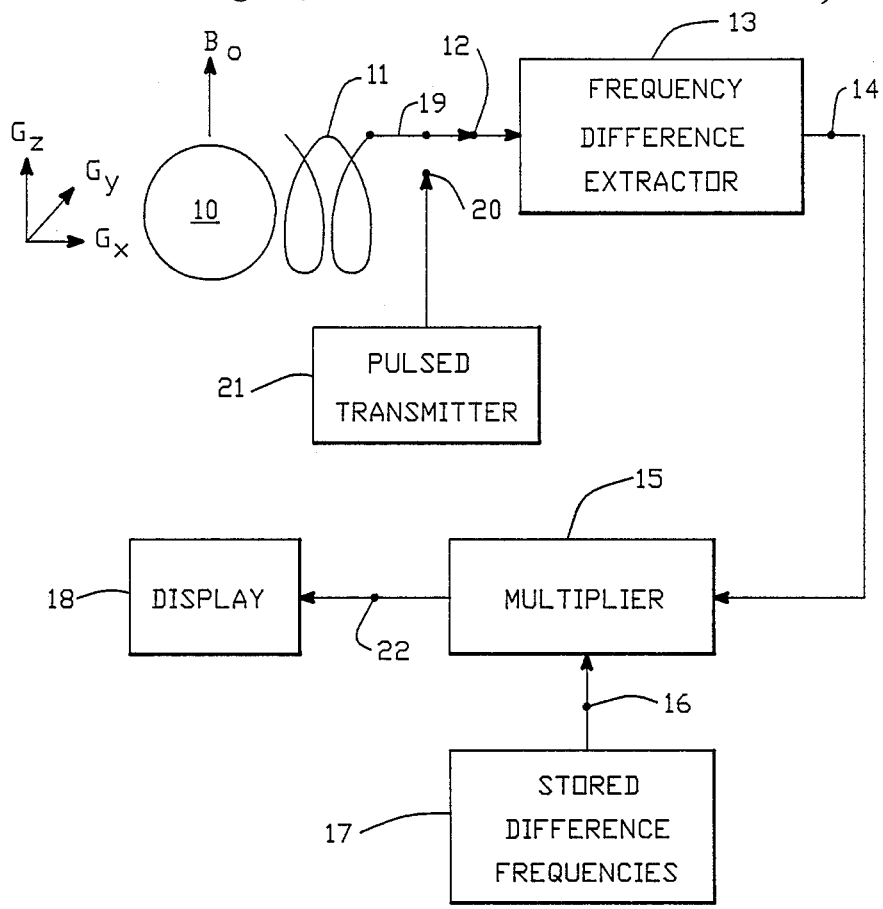
FIG. 1 is a schematic representation of an embodiment of the invention using frequency differences of the received signals.

An understanding of the broad aspects of the invention may best be had by reference to FIG. 1 where the spectroscopic components of object 10 are being measured. In general object 10 can be material in a test tube, or a large object, such as the human body, where we wish to make a map of important spectroscopic components. In all cases we will have a strong magnetic field $B_0$, of the order 0.1–10 Tesla, which is shown, arbitrarily, as being along the z axis. In the case of in vitro analysis of materials in a test tube, this is essentially the only static magnetic field. Where imaging of an object is involved, an array of gradient waveforms, $G_x$, $G_y$ and $G_z$ are used to obtain localization to any point in object 10.

In any case, object 10 is excited by a r.f. burst from pulsed transmitter 21 with switch 19 connected to point 20. If the gradients are off, this excites the spins throughout object 10 and tips them into the x, y plane where they will produce radio frequency signals. Using various gradients, a portion, such as a slice, of object 10 can be selectively excited. For example, in the presence of an appropriate $G_z$ gradient, a slice is selected in the x, y planes at various z positions.

Immediately following selective excitation switch 19 is moved to position 12 to receive the magnetic resonance signal. The frequency or frequencies of the received signal 12, at each local region, will follow the Lamor relationship $\omega = \gamma H$ where $\omega$ is the instantaneous frequency, $\gamma$ is the gyromagnetic ratio for each spectroscopic component and H is the local magnetic field. Thus, any spatial or temporal errors in the local field are immediately translated into frequency errors. This makes it very difficult to estimate the amplitude of specific components.

This problem is solved by first applying signal 12 to frequency difference extractor 13 which extracts the difference frequency of the received signals between a desired spectroscopic component, such as lactate in the hydrogen spectrum, and a reference component, such as water. It should be noted that signal 12 is shown directly as the incoming antenna signal. In many cases a heterodyne or mixer system, not shown, is used to translate the incoming signal down to a more convenient frequency. In many cases it is translated down to a baseband signal having an inphase I and quadrature Q component by using cosine and sine versions of the nominal carrier frequency. All of these are not shown in FIG. 1. In any case it must be emphasized that the frequency difference signals 14 derived in 13 will be the same, independent of frequency translation.

In the case where object 10 is a test tube, without gradients, signal 14 will be the difference between the various spectroscopic components and a reference component such as water. In that case each spectroscopic component in 14 is at a known frequency, independent of $B_0$. The desired amplitude of that known frequency can be extracted using various known procedures. One effective procedure is the multiplication of signal 14 by the known frequencies of the various components. The difference frequencies between the various spectroscopic components and, for example, water are stored in 17. The desired one, signal 16 is applied to multiplier 15 where it is multiplied by signal 14. This provides a low frequency or constant output 22 for only the chosen spectroscopic component, with all other providing higher frequencies. If output 22 is followed by a low-pass filter or integrator, not shown, it will extract only the desired spectral component as represented by the frequency of signal 16.

Once a stable predictable spectrum exists, as in difference frequency spectrum 14, a number of related approaches can be used to extract the desired component or components. For example, for improved SNR, a "matched" filtering system can be used where stored signal 16 is not only at the correct frequency, but also is subject to the known relaxation time $T_2$ providing an exponential damping of $e^{-t/T_2}$. Alternatively an estimation approach can be used on signal 14, once its frequencies are stablized, as described in the previously referenced paper by A. Macovski and D. Spielman.

In some cases, such as the inorganic phosphate line of the $^{31}P$ spectrum, the frequency itself moves around under different biological conditions. In the case of inorganic phosphate, pH changes result in different frequencies. However, as long as the frequency range is small, and known, as it is in these cases, the amplitude within the spectral width can be estimated. Alternatively a frequency estimation approach can first be used on signal 14, within the known frequency range for a species of interest. The estimated frequency can then be used in multiplier 15 to extract the amplitude of that component. Examples of frequency estimation in the presence of noise are given in the book by H. L. Van Trees, Detection Estimation and Modulation Theory, Part 1, John Wiley & Sons, N.Y., 1968. In general, with any of the processing alternatives, the operation needn't be done in real time. Signal 12 and/or signal 14 can be stored for subsequent off line processing.

The system of FIG. 1, as shown, without gradients, will find the relative amplitudes of the spectroscopic components in object 10 and display them in 18. This would affectively provide in vitro spectroscopy with immunity to $B_0$ changes. If spectroscopic imaging is desired we use the system of gradients to provide localized spectral information. One approach is the 3DFT or 3DFT spectroscopic imaging system previously referenced where the 3DFT provides either a planar or projection 2D image, and the 4DFT provides a 3D image. If selective excitation is used, with for example the $G_z$ gradient present during the r.f. pulse from 21, then a slice in the x, y plane will be selected. Following the excitation, $G_x$ and $G_y$ components are used in different combinations until we have an $N \times N$ image. Signal 12 is received immediately following the $G_x$ and $G_y$ phase encoding gradient waveforms.

Figure 2:
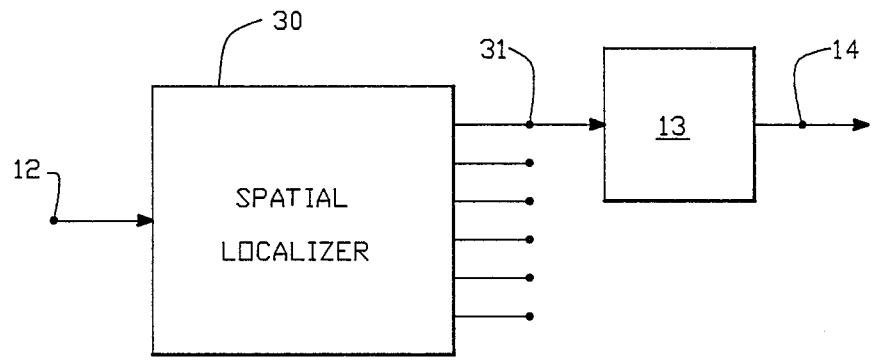
FIG. 2 is a schematic representation of the use of spatial localization with the embodiment of FIG. 1, FIG. 3a and 3b are a schematic representation of an envelope embodiment of obtaining difference frequencies.

To provide an image, as shown in FIG. 2, signal 12 is processed in spatial localizer 30. In the case of the 3DFT system described, a two-dimensional Fourier transform is taken at each corresponding time sample of signal 12 of each of the $N \times N$ excitations. Thus each time sample involves a 2D transform of $N^2$ points. The requirements on the time samples will be considered subsequently. Following the 2DFT at each time sample, we have an array of $N^2$ object locations, such as point 31, each with an array of time samples. In 3DFT systems, as in the present literature, each signal 31 would be Fourier transformed to provide the spectrum at each point. This would suffer from all the $B_0$ drifts and inhomogeneity where the spectrum at each point would be shifted an unknown arbitrary amount, making spectroscopic imaging almost impossible. In this case, however, each localized signal 31 is applied to frequency difference extractor 13 and processed as previously described, providing the amplitude of the desired components at each local voxel. These are then displayed as the desired spectroscopic image in 18.

The sampling rate of signal 12 following each excitation is based on the bandwidth of the spectrum being studied. Ideally it would be equal to the spectral bandwidth. However, considering the anticipated inhomogeneity, it must be somewhat greater. For the proton spectrum, the required bandwidth is approximately 1.0 kHz. Thus the k space samples, or spatial localizer 30 can use a frequency of approximately 1.0 kHz.

One simple but effective version of the frequency difference extractor 13 is the magnitude or envelope detector shown in FIG. 3a. This can be a diode rectifier as shown in FIG. 3a. Alternatively it can be a pair of quadrature detectors where the signal is multiplied by $\cos\omega_0 t$ and $\sin\omega_0 t$ and low-pass filtered in the classic way to provide I and Q signals. The frequency $\omega_0$ is nominally the carrier signal, although it needn't be exact. We then form $\sqrt{I^2+Q^2}$ to represent the magnitude. In most tissue the water line dominates the proton spectrum. Therefore the signal 12, or 31 if imaging is used, consists of a large water line $a_w \cos\omega_w t$, and a sum of smaller spectroscopic components $\Sigma a_n \cos\omega_n t$. For the case where the water line dominates, that is $a_w >> \Sigma a_n$, the envelope $E=\sqrt{I^2+Q^2}$ after removing high frequency components is given by $$E \cong a_w + \Sigma a_n \cos\omega_{nd}$$

where $\omega_{nd}$ is the angular difference frequency between each spectroscopic component and the water line. This envelope or magnitude signal will remain the same as shown above, independent of frequency changes due to magnet drift or inhomogeneity. Thus magnitude detection provides us with an array of signals at the initial relative amplitude $a_n$ with very stable frequencies $\omega_{nd}$ which are immune to inhomogeneity. Filter 35 can be used to remove the low frequency component from the envelope representing the water line $a_w$, and pass solely the spectroscopic components. Alternatively, it can be used to pass specific spectroscopic components desired. The spectroscopic signals with stable difference frequencies 14 are then passed to multiplier 15 where the stored difference frequencies 16 are used to extract the desired amplitudes.

Another desirable property of the magnitude detector approach is that of dynamic range. Often spectroscopic components have unusually large amplitude ratios. For example the important lactate signal in the hydrogen spectrum can be 10,000 times lower than the water line. This presents a problem if the incoming signal 12, or a heterodyned version, is to be digitized, using an A to D converter, to enable further digital processing. Most digital system cannot handle this dynamic range, representing about 17 bits or greater. Using the system of FIG. 3a, an analog signal 12 can be applied to envelope detector 36 and 37. Filter 35 removes the large d.c. and low frequency components of the signal providing signal 14 which can then be digitized with a much fewer number of bits.

With imaging systems, however, it is usual that the spatial localizer 30 is a digital operation so that signal 12 would, in most cases, be digitized, providing a dynamic range problem. One method of reducing the required dynamic range, in that case, is to properly shape excitation burst 20 so that its component at the water line is reduced. It still is sufficiently large for envelope detection but its dynamic range is sufficiently reduced to enable digitization. One potential problem with this approach is that water suppression or reduction techniques perform poorly in regions of inhomogeneity because of the shifted frequency of the water line.

One appoach to obtain both spatial selectivity and deal with the large dynamic range is to use selective excitation. Here the gradients are used during the excitation process to select a region to be studied. One approach, which is described in a paper by J. Frahm et al. in J. Magnetic Resonance, 64:81–93 (1985), uses a sequence of gradients where first a plane is selected, followed by an orthogonal plane to select a line, followed by a third orthogonal plane to select a point. Signal 12, in that case, represents a selected region and can be processed using the system of FIG. 3a despite the large dynamic range. An image is then created by sequencing through the points of interest. This approach does, however, represent a reduced SNR because the time involved receiving signals from each point is reduced compared to the system of FIG. 2. As a compromise, excitation sequences can be used which excite a line, rather than a point. In that case, it is not unreasonable to have spatial localizer 30 be an analog processor consisting of an array of conjugate gradient modulators, reconstructing each point along the line. Here signals 31 are applied to an array of envelope detectors whose outputs are filtered and then digitized, thus dealing with the large dynamic range. The line can then be translated to form a planar image.

The output 14 of filter 35, or of any frequency difference detector, will have each spectroscopic component in a known phase, since both the water line and the spectroscopic lines are excited together and thus start in phase. Therefore they can be multiplied by stored signal 16 which has a predetermiend phase. This represents an improvement in SNR since, if the desired signal had random phase, we would be required to include both in phase and quadrature components, thus reducing the SNR.

The system of FIG. 3a, however, can have a noise disadvantage. Assume we are studying a spectroscopic signal 200 Hz above the water line. We therefore use a 200 Hz stored signal 16 to extract its amplitude. However, noise components 200 Hz below the water line will also appear and somewhat degrade the signal. These can be undone using the predetection filter of FIG. 3b. Here a filter 38 is used on some version of the incoming signal, either at the high frequency or preferably heterodyned down. This filter 38 is shown passing signals $\omega_n$ on only one side of the water line and rejecting or attenuating the corresponding difference frequencies on the other side.

An alternate approach to producing the difference frequencies is shown in FIG. 3c. Here, rather than use a magnitude detector, a carrier frequency signal, such as at the frequency of the water line, is produced. This can be done where controlled oscillator 40 is a classic phase-locked loop with a controlled oscillator which is locked to the water line using a phase comparator driving the controlled oscillator. The filter following the phase comparator can be sufficiently narrow band to reject the spectroscopic signals and insure a pure signal 41 at the frequency of the water line. Alternatively 40 can include a counter which counts the cycles of the water line to determine its frequency. The resultant count can be used to generate the water carrier signal 41.

Following the generation of a stable reference signal 41, a difference signal is produced in mixer 42 which multiplies signal 41 with incoming signal 12 or 31 and produces difference signal 14 following previously described filter 35. The system of FIG. 3c has the same noise considerations as that of FIG. 3a and can also benefit from pre-detection filter 38.

In the systems of FIGS. 1-3, a stable difference difference frequency was produced using a strong signal in the spectrum, such as the water line. FIG. 4 shows an alternate approach where the water line is used on the stored frequencies rather than on the signal frequencies. Here controlled oscillator 40 is again used to provide a signal 41 locked to the water frequency. The frequency of the signal 41 will therefore follow all of the variations due to local changes or drift in the magnetic field. The nominal frequencies of the spectroscopic signals, appropriately translated, are stored in 17. The selected frequency 16 is mixed with the reconstructed water signal 41 in mixer 43 to provide signal 44 which is at the desired spectroscopic frequency of signal 12. If the entire signal spectrum 12 is shifted in frequency, signals 41 and 44 will experience the same shift. Thus signal 44 is multiplied with signal 12 or 31 in multiplier 15 to extract the desired spectroscopic amplitude and display it in 18. In all of the described operations the signals can be processed in real time, or first stored and then processed.

Figure 5:
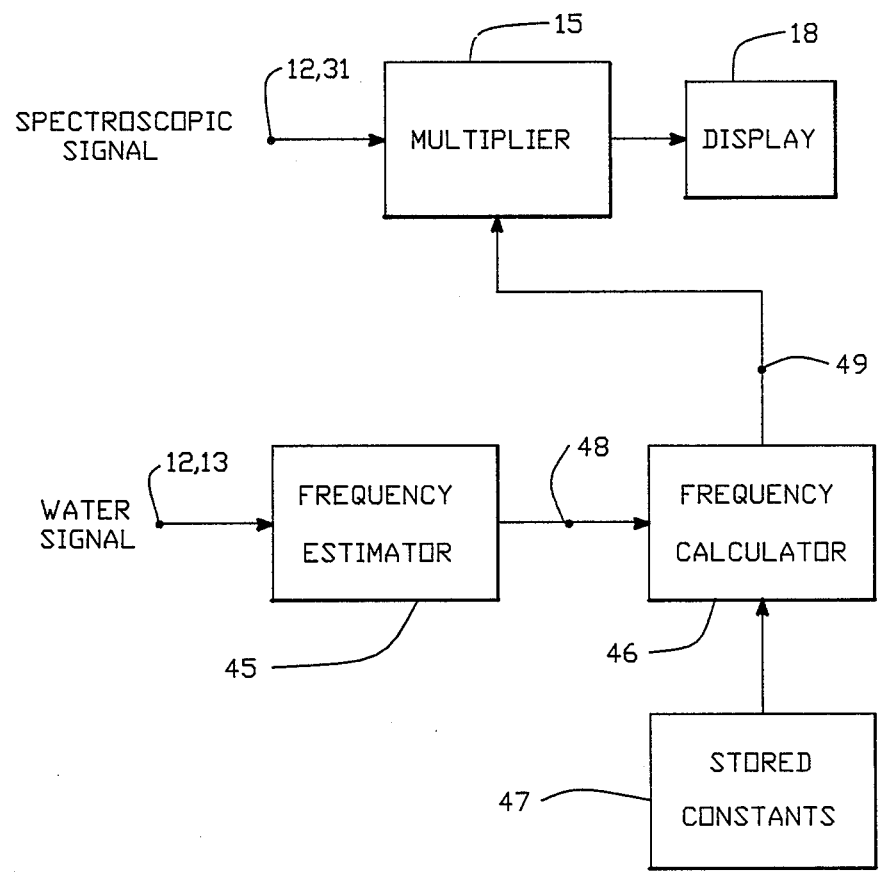
FIG. 5 is a schematic representation of an embodiment for measuring spectroscopic signals from different chemical species.

The systems described thusfar used the water line of the hydrogen spectrum to extract the spectroscopic components in the hydrogen spectrum independent of frequency shifts. This same procedure can clearly be applied in other spectra if we use a relatively large line within the spectra for either magnitude detection or to operate a controlled oscillator. For example the phosphocreatine line in the $^{31}P$ spectrum could be used. However, unlike the water line, it becomes diminished under certain hypoxic conditions. The system of FIG. 5 shows an alternate approach toward using the water line whereby it can serve to find the spectroscopic amplitudes of both under hydrogen spectroscopic components and those of different species such as $^{31}P$. Assume we excite at the nominal water frequency $Y_w H_0$ where $H_0$ is the nominal magnetic field and $Y_w$ is the gyromagnetic ratio of water. The received signal at each voxel will be at frequency $\gamma_w H$ where H is the local magnetic field. If we use synchronous detection, not shown, with the receiver reference at $\gamma_w H_0$, we receive the signal $\gamma_w(H-H_0)$. Simultaneously or sequentially we excite the phosphorous spectrum. Assume we wish to study a component with gyromagnetic ratio $\gamma_p$. We demodulate with frequency $\gamma_1 H_0$, a nominal frequency within the phosphorous spectrum. Therefore the frequency produced by the desired phosphorous component in $\gamma_p H - \gamma_1 H_0$. We need to find this frequency in order to find the amplitude of the component at $\gamma_p$. We use the relationship $$(\gamma_p H - \gamma_1 H_0) = (\gamma_p - \gamma_1)H_0 + \gamma_p(H - H_0)$$
$$= (\gamma_p - \gamma_1)H_0 + \left[\frac{\gamma_p}{\gamma_w}\right]\gamma_w(H - H_0)$$

We thus structure the desired frequency completely in terms of measured and known components. $(\gamma_p - \gamma_1)H_0$ is known since each constant is known. Similarly $\gamma_p/\gamma_w$, the ratio of the gyromagnetic ratios, is known. Also $\gamma_w(H-H_0)$, the error in the magnetic field, is known from the measurement of the water line. Thus a measurement of the frequency of the water line, using a controlled oscillator or counter, enables signals in different species to be identified.

Referring to FIG. 5, frequency estimator 45, as with those previously described, extracts the frequency of the water signal and, using a mixer or multiplier, finds the difference frequency 48, $\gamma_w(H-H_0)$ between the received water signal and stored nominal reference signal at $\gamma_w H_0$. This signal is applied to frequency calculator 46 which calculates the frequency of the desired spectroscopic component $\gamma_p H - \gamma_1 H_0$. To perform this calculation it takes the output of the frequency estimator 48, the frequency $\gamma_w(H-H_0)$ and takes the value $\gamma_p$ from the stored constants in 47. Here $\gamma_p$ represents the desired component in the phosphorous spectrum. In addition the fixed constant $\gamma_1$ is stored in frequency calculator 46, nominally a digital processor. This constant is represented by $\gamma_1 H_0$, the nominal received frequency in the phosphorous spectrum. Using all of the inputs to 46, signal 49 is generated representing $\gamma_p H - \gamma_1 H_0$, the difference between the actual spectroscopic component $\gamma_p H$ and the nominal frequency $\gamma_1 H_0$, independent of the local magnetic field H.

The input spectroscopic signal 12 or 31 has been synchronously detected at the phosphorous nominal frequency $\gamma_1 H_0$, so that the desired component is at $\gamma_p H - \gamma_1 H_0$. This signal, as previously described, is extracted with multiplier 15 and displayed in 18.

The reference and signal operations can take place simultaneously. That is the water signal and spectroscopic signals can be received simultaneously and processed to extract the desired component, where the strong water line is used to find the correct phosphorous frequency. Alternatively the signals can be received in sequence where, for example, we first receive the water signal to provide $\gamma_w(H-H_0)$ and then receive the signals from the phosphorous spectrum after $\gamma_p H - \gamma_1 H_0$ has been calculated and used to extract the desired component. This is also true for the systems of FIGS. 3c and 4 where the extracted carrier signal 41 can be stored and then used to extract the desired spectroscopic information. If we are studying components in the same spectrum, such as the hydrogen spectrum, this enasbles us to first extract the water frequency 41 and then, when the spectroscopic components are being found, to suppress the water line during r.f. excitation. In this way the large dynamic range never need be considered, since the large water line is suppressed when the spectroscopic components are received.

Although FIG. 5 was described as a method of receiving components from species other than hydrogen, while using the water line as a reference, it can of course be also used for hydrogen. If we simply set $\gamma_1$ equal to $\gamma_w$, it becomes an alternate method for the hydrogen spectrum.

Throughout the description, frequency differences are shown as the sole method of discriminating between the various species. As is well-known in NMR spectroscopy, other methods can be used to enhance the separation. Time reversal 180° r.f. bursts can be used on the received signal to alter the relative phase distribution. Therefore, these can be used to help separate two components by applying the time-reversal 180° burst, when, for example, one component is in or out of phase with the water line, and the other is in quadrature. In this case the relative phase of the difference signals with water will reverse. Thus, if performed on alternate excitations, adding and subtracting the two difference signals will enhance the separation. Other well-known separation schemes include the simple expedient of receiving signals a relatively long time following excitation where one $T_2$ relaxation time exceeds the other, so that the amplitude differences are enhanced. Also, a variety of well-published selective excitation schemes can be used, especially with multiple-line components. In any case, the use of a strong component, primarily the water line, to as certain the local magnetic field or nominal frequencies enables the efficient extraction of the desired components.

What is claimed:

1. In a method for deriving the amplitude of a weak spectroscopic component in a magnetic resonance signal received from a volume positioned in a magnetic field having unknown localized magnetic field variations, said magnetic resonance signal having a strong spectroscopic component therein, the method comprising the steps of
   receiving a magnetic resonance signal,
   identifying a first reference spectroscopic component in said magnetic resoance signal,
   deriving a difference frequency spectrum between said reference spectroscopic component and other spectroscopic components including a second spectroscopic component,
   obtaining the amplitude of said second spectroscopic component from said difference frequency spectrum by using a known frequency difference between said reference spectroscopic component and said second spectroscopic component, and
   measuring the amplitude of said second spectroscopic component.

2. The method as described in claim 1 where the step of obtaining the amplitude of the second spectroscopic component includes the steps of multiplying said difference frequency spectrum by a stored signal having the known difference frequency and filtering the multiplied signal.

3. The method as described in claim 1 including the step of applying magnetic gradients following excitation of the volume in identifying the first component to enable the received signal to be localized to selected regions of the volume.

4. The method as defined by claim 1 wherein said step of obtaining the amplitude of said second spectroscopic component includes heterodyning said difference frequency spectrum with said known frequency difference.

5. Apparatus for deriving the amplitudes of spectroscopic components in a magnetic resonance signal received from a volume comprising:
   means for receiving a magnetic resonance signal;
   means for identifying the frequency of a first spectroscopic component;
   means for extracting the frequency of a second spectroscopic component substantially independent of the static magnetic field using the frequency of said first component and a known frequency difference between said first spectroscopic component and said second spectroscopic component including
   means for extracting an error signal whose frequency represents the frequency change of the first spectroscopic component due to errors in the static magnetic field;
   means for multiplying the frequency of the error signal by a factor based on the gyromagnetic ratio of the second spectroscopic component; and
   means for using the result of the multiplication to find the received signal of the second spectroscopic component.

6. Apparatus as described in claim 5 where the second spectroscopic component comes from a different chemical species than that of the first.

7. Apparatus for deriving the amplitudes of spectroscopic components in a magnetic resonance signal received from a volume comprising
   means for receiving a magnetic resonance signal,
   means for identifying a first reference spectroscopic component in said magnetic resonance signal,
   means for deriving a difference frequency spectrum between said reference spectroscopic component and other spectroscopic components including a second spectroscopic component,
   means for obtaining the amplitude of said second spectroscopic component from said difference frequency spectrum by using a known frequency difference between said reference spectroscopic component and said second spectroscopic component, and
   means for measuring the amplitude of said second spectroscopic component.

8. Apparatus as defined by claim 7 wherein said means for obtaining the amplitude of said second spectroscopic component includes means for heterodyning said difference frequency spectrum with said known frequency difference.

9. Apparatus as described in claim 7 where the means for obtaining the second spectroscopic component includes means for combining the frequencies of the first reference spectroscopic component and a stored signal to provide a demodulating signal whose frequency is equal to that of the received second spectroscopic component.

10. Apparatus as described in claim 9 wherein the means for combining the frequencies of the first reference spectroscopic component and stored signal includes means for deriving a continuous wave signal at the same frequency as the first spectroscopic signal and mixing it with the stored signal.

11. Apparatus as described in claim 7 where the first spectroscopic component is the water line of the hydrogen spectrum.

12. Apparatus as described in claim 7 including means for exciting a selected region in the volume prior to receiving the magnetic resonance signal whereby the received signals will represent solely the selected volume.

13. Apparatus as described in claim 12 including means for applying magnetic gradients following excitation of the volume in identifying the first component to enable the received signal to be localized to selected regions of the volume.

* * * * *